United States Patent [19]

Coupard et al.

[11] Patent Number: 4,841,692

[45] Date of Patent: Jun. 27, 1989

[54] SHIELDED ACCESS APPARATUS FOR USE IN AN ENCLOSURE FOR PREVENTING PROPAGATION OF ELECTROMAGNETIC ENERGY INTO OR OUT OF THE ENCLOSURE

[75] Inventors: Donald N. Coupard, Bethesda; Andrew K. Chang, Potomac; John E. Fuller, Brookeville, all of Md.; Angelo J. Mauriello, Southampton, Pa.

[73] Assignees: Donald N. Coupard, Bethesada; Andrew K. Chang, Potamac; John E. Fuller, Brookeville, all of Md.; Angelo J. Mauriello, Southampton, Pa.; a part interest

[21] Appl. No.: 150,069

[22] Filed: Jan. 29, 1988

[51] Int. Cl.⁴ .......................... H05K 9/00; E06B 7/22; E06B 1/04

[52] U.S. Cl. ...................... 52/173 R; 52/33; 52/204; 109/1 R; 109/49.5; 109/84; 174/35 MS

[58] Field of Search ...................... 52/22, 33, 198, 204, 52/173 R, 741, 302; 109/1 R, 15, 24, 35, 49.5, 82, 84, 85; 174/35 MS, 35 R

[56] References Cited

U.S. PATENT DOCUMENTS

| | | | |
|---|---|---|---|
| 1,780,108 | 10/1930 | Barry | 109/84 |
| 2,870,439 | 1/1959 | Stinehelfer | 174/35 MS |
| 2,925,457 | 2/1960 | Lindgren | 174/35 MS |
| 3,092,218 | 6/1963 | Clay | 174/35 MS X |
| 3,229,429 | 1/1966 | Conrad | 52/173 R X |
| 3,334,597 | 8/1967 | Ruskin et al. | 109/1 R |
| 3,493,760 | 2/1970 | Hoadley | 174/35 MS |
| 3,584,134 | 6/1971 | Nichols | 174/35 MS |
| 3,608,280 | 9/1971 | Martin | 174/35 MS X |
| 3,745,226 | 7/1973 | Nichols et al. | 174/35 MS |
| 4,556,757 | 12/1985 | Oberlach | 174/35 R |

FOREIGN PATENT DOCUMENTS

| | | | |
|---|---|---|---|
| 2419792 | 11/1975 | Fed. Rep. of Germany | 174/35 MS |
| 787915 | 10/1935 | France | 109/49.5 |
| 542587 | 1/1942 | United Kingdom | 52/404 |

Primary Examiner—John E. Murtagh
Assistant Examiner—Andrew J. Rudy
Attorney, Agent, or Firm—Burns, Doane, Swecker & Mathis

[57] ABSTRACT

A shielded access apparatus for enabling personnel access to an enclosure which is shielded to prevent propagation of electromagnetic energy into and out of the enclosure. The apparatus includes an access enclosure of electrically conductive material and first and second openings in the enclosure. A shield is positioned in the enclosure between the first and second openings for preventing radiated electromagnetic energy passing through one of the openings from travelling along a straight line to the other opening. Absorption material lines the interior of the enclosure and absorbs radiated electromagnetic energy passing through the enclosure.

12 Claims, 3 Drawing Sheets

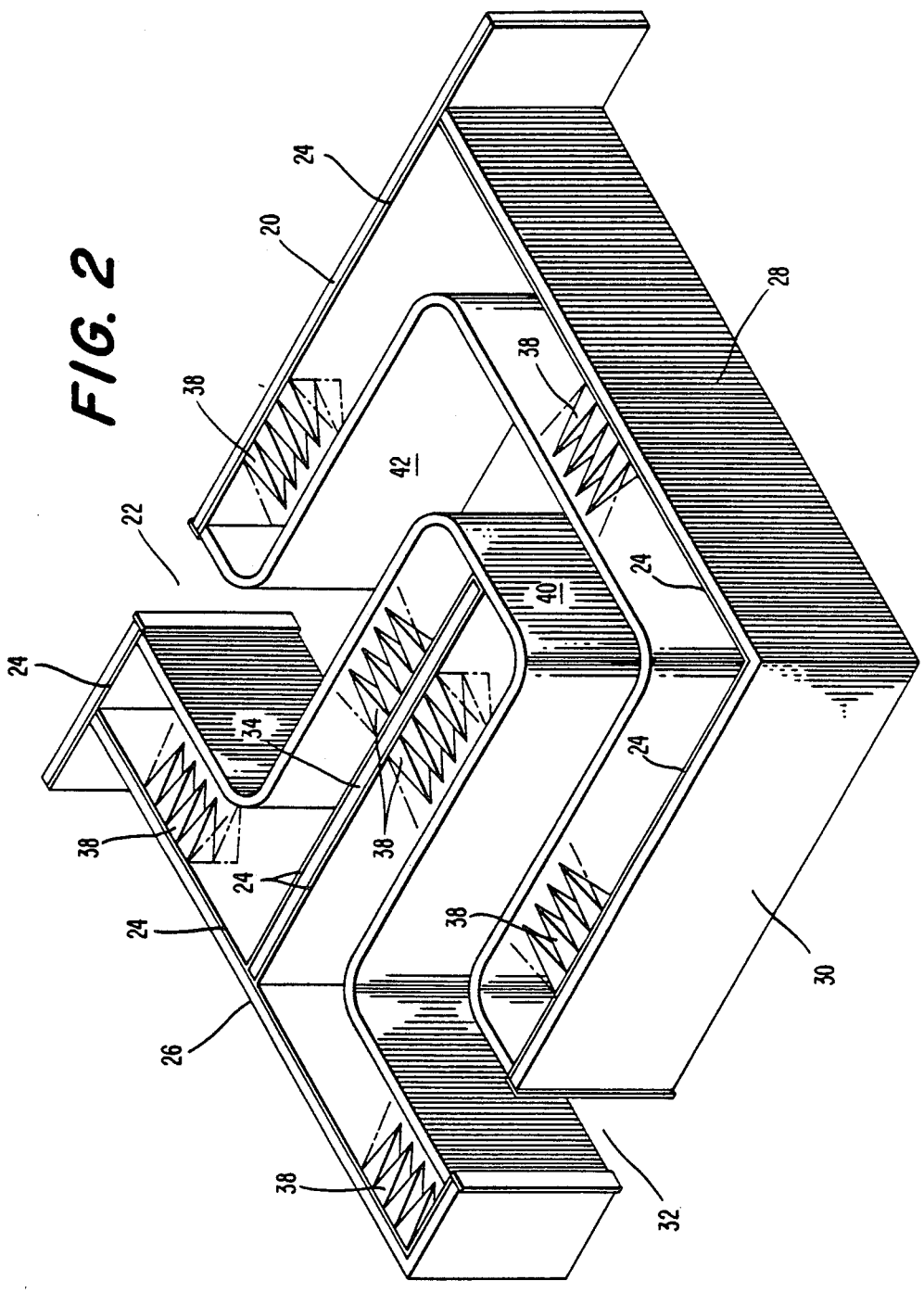

SHIELDED ACCESS APPARATUS FOR USE IN AN ENCLOSURE FOR PREVENTING PROPAGATION OF ELECTROMAGNETIC ENERGY INTO OR OUT OF THE ENCLOSURE

BACKGROUND OF THE INVENTION

The present invention relates generally to personnel access apparatuses for enclosures and, more particularly, to a shielded access apparatus for enabling personnel access to an enclosure which is shielded to prevent radiated electromagnetic energy from passing into or out of the enclosure.

It is known that electromagnetic waves can be shielded by an enclosure that is continuously and completely surrounded by an electrically conductive material. Conventional shielded enclosures that employ this concept include either metal components that are continuously welded along all abutting edges or a thin electrically conductive foil applied over the surface of the enclosure to be shielded. Another possible enclosure construction is disclosed in U.S. application Ser. No. 150,286 filed Jan. 29, 1988, which is a continuation of U.S. application Ser. No. 001,225 filed Jan. 6, 1987, now abandoned, by the present inventors and includes an overlapping sheet shielding arrangement which effectively prevents propagation of radiated electromagnetic energy into or out of the enclosure.

Access apparatuses for shielding enclosures have typically included some form of shielded door arrangement. For example, one conventional type of entrance assembly includes two spaced shielded doors and a shielded vestibule extending therebetween. This type of device provides an effective shielding against the propagation of electromagnetic waves when either or both of the shielded doors are closed. This permits personnel to enter or egress the enclosure by passing first through one of the shielded doors, closing that door, and then opening and passing through the second door. As can be appreciated, this type of access device limits the rate of personnel flow into and out of the enclosure. Frequently, this posses no problem. However, where a multiroom or multiple storied enclosure is involved, it would be desirable to provide an access apparatus that both effectively shields radiated energy and permits high flow rates of personnel into and out of the enclosure.

In addition, it would be desirable to provide a shielded access apparatus which permits a high rate of personnel flow but which occupies a reasonable amount of space and which does not require a burdensome effort by personnel passing into or out of the enclosure.

In the above-mentioned prior art apparatuses, as with any entrance apparatus having doors, there exists an occasional expense for maintaining and repairing the doors. This expense can be substantial in apparatuses servicing high numbers of people which are exposed to heavy traffic. It would be desirable to provide a shielded access apparatus that can handle heavy flow rates but which has low maintenance costs as compared to prior art apparatuses servicing flow rates.

SUMMARY OF THE INVENTION

The present invention relates to a shielded access apparatus for enabling personnel access to and from an enclosure which is shielded to prevent propagation of radiated electromagnetic energy into or out of the enclosure. The apparatus comprises an access enclosure of electrically conductive material and first and second openings in the enclosure. A shielding means within the enclosure is positioned between the first and second openings for preventing radiated electromagneteic energy passing through one of the openings from travelling along a straight line to the other opening. Means are also provided within the enclosure for absorbing radiated electromagnetic energy passing through the enclosure.

BRIEF DESCRIPTION OF THE DRAWINGS

The many objects and advantages of the present invention are evident from the following detailed descripton of a preferred embodiment of the invention. The detailed description is to be considered in cooperation with the attached drawing in which like reference numerals are used to designate similar elements in the several figures and in which:

FIG. 2 is a perspective view of a preferred shielded access apparatus wall structure;

DETAILED DESCRIPTION OF THE PREFERRED EMBODIMENT

Figure 1:
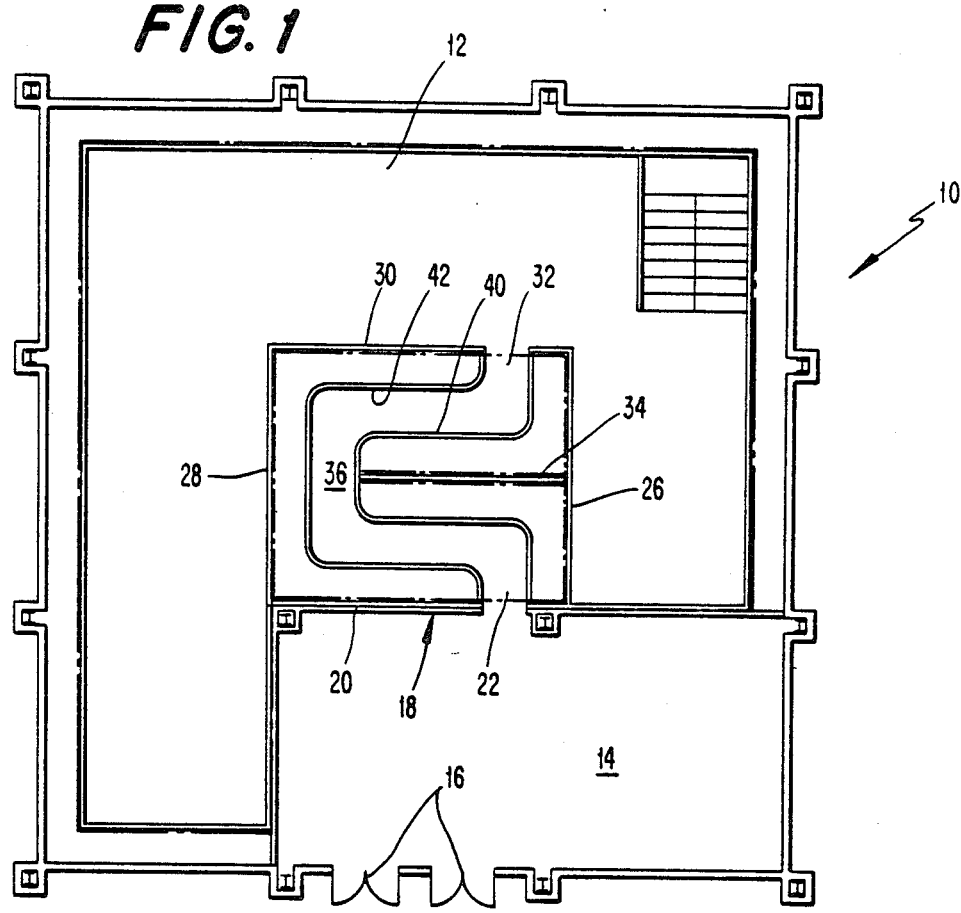
FIG. 1 is a top sectional view of a shielded enclosure including an access apparatus according to the invention.

A building 10 is shown in FIG. 1 which includes a shielding enclosure 12 for preventing the propagation of radiated electromagnetic energy into or out of the enclosure 12. A non-shielded area 14 is provided between the shielding enclosure 12 and a conventional building entrance 16 and accesses the enclosure 12 through a shielded access apparatus 18 having shielded walls, a shielded ceiling and a shielded floor in accordance with a preferred embodiment of the invention.

The preferred access apparatus 18 is shown in FIG. 2 without a roof to illustrate the preferred features of the apparatus.

A first shielded peripheral wall 20 separates the shielded enclosure 12 from the non-shielded area 14 and includes an opening 22 through which personnel can pass to enter and exit the access apparatus 18 from the non-shielded area 14. The specific construction of the shielding 24 is not critical and any known shielding components may be employed such as but not limited to those mentioned in the Background of the Invention. It is preferred that the overlapping sheet arrangement of the above-mentioned copending application be employed to form the shielding and the information contained in that application is incorporated herein by reference. Two additional shielded peripheral walls 26, 28 extend into the shielded enclosure 12 from the first shielded peripheral wall 20 and these two walls 26, 28 are joined by a fourth shielded peripheral wall 30 which extends in a direction parallel to the first wall 20. These four peripheral walls 20, 26, 28, 30 define the perimeter of a shielded enclosure of the access apparatus 18. The fourth wall 30 has a second opening 32 which is positioned roughly opposite the first opening 22 and which allows access between the shielding enclosure 12 and the access apparatus 18. A shielded interior wall 34 is provided which extends from one of the peripheral walls 28 into the interior of the apparatus 18 and between the two openings 22, 32. The wall 34 is positioned so that any straight line extending between the two openings 22, 32 intersects the wall 34. This prohibits electromagnetic waves which propagate through one of the openings from travelling directly to the other opening and the shielding 24 on the wall 34 reflects the waves back towards the opening through which they entered the apparatus.

The walls 20, 26, 28, 30, 34 define a passage 36 through the apparatus 18 which has at least one but preferably no more than four turns between the two openings. The entire inside surface area of the peripheral walls and at least one side of the inside wall are covered by shielding 24 and an absorbent anechoic material 38 is additionally provided over the interior wall area including both sides of the inside wall 34 to absorb electromagnetic waves propagating towards and away from the shielding 24 on the walls 20, 26, 28, 30, 34. Protective walls 40, 42 made of any conventional non-conductive material line the passage 36 to protect the anechoic material 38 from being rubbed or brushed by personnel passing through the apparatus 28. The anechoic material employed is selected according to the needs of any given access apparatus based on desired energy and attenuation levels which are to be shielded.

Figure 3:
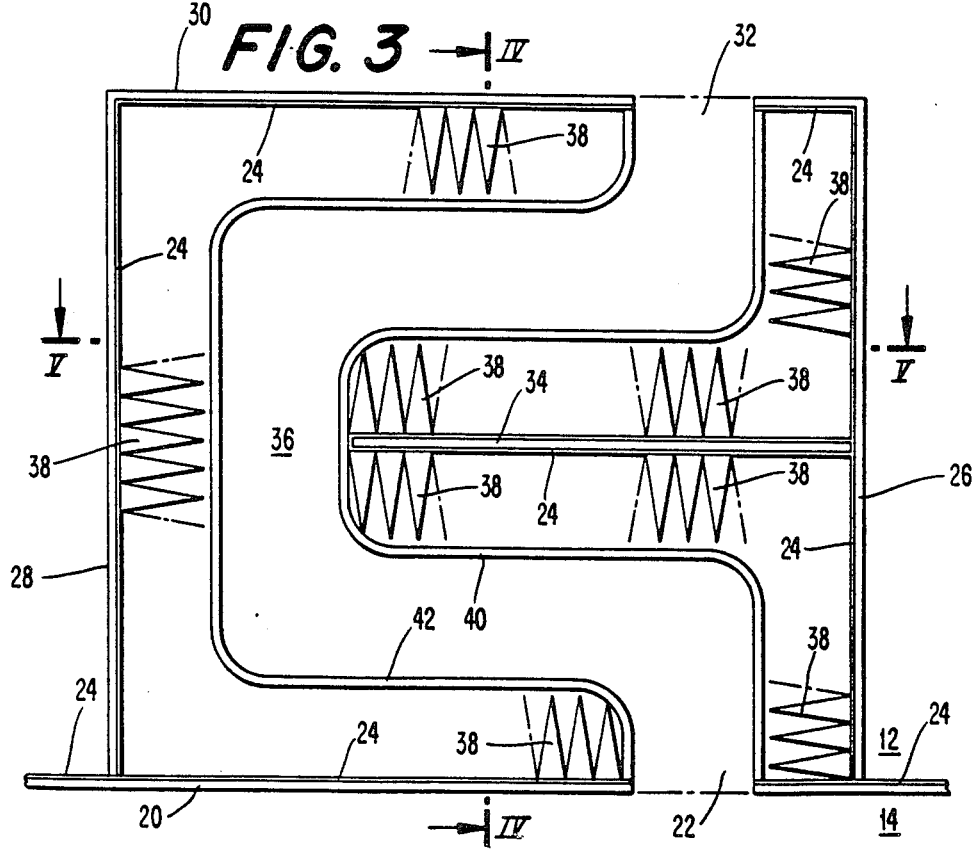
FIG. 3 is a top sectional view of the preferred shielded access apparatus.

FIG. 3 illustrates the orientation of the walls 20, 26, 28, 30, 34 and the path of the passage 36 through the apparatus 18. The wall shielding 24 and anechoic material 38 extend inwardly from the inside surfaces of the peripheral walls 20, 26, 28, 30 and to either side of the interior wall 34 to provide a substantial volume of the anechoic material within the apparatus 18 and to restrict the amount of free space in the apparatus 18 through which electromagnetic waves can freely travel. As mentioned, the protective walls 40, 42 line the passage 36 and prevent the anechoic matrial from being damaged.

Figure 4:
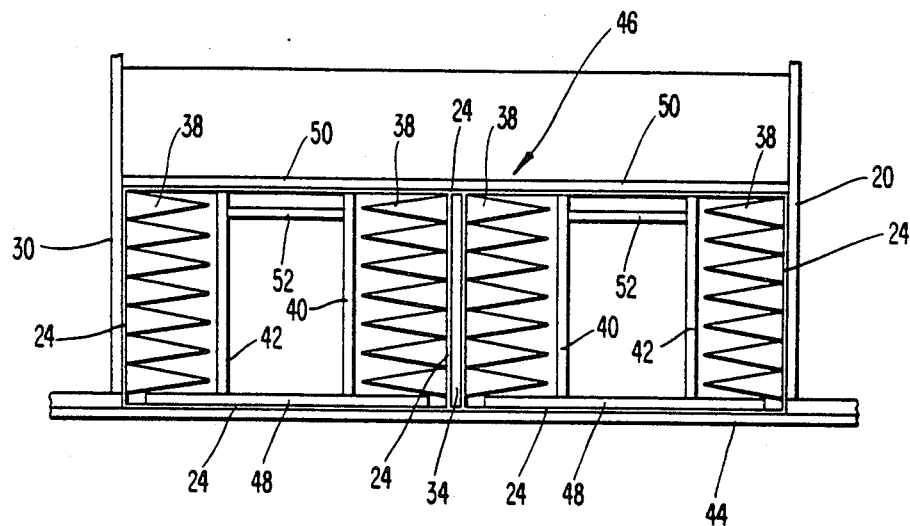
FIG. 4 is a side sectional view of the preferred shielded access apparatus as viewed along line IV—IV of FIG. 3.
Figure 5:
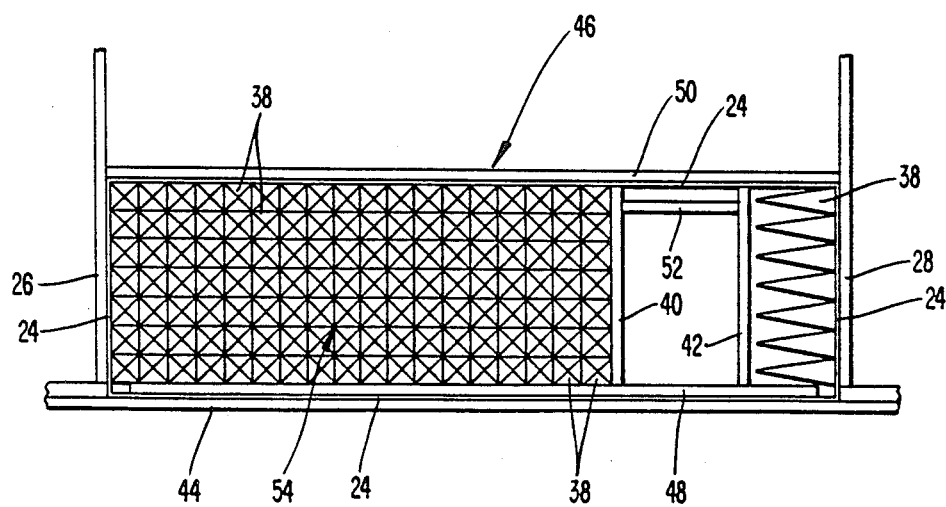
FIG. 5 is a side sectional view of a preferred shielded access apparatus as viewed along line V—V of FIG. 3.

Two side views each illustrating the floor 44 and ceiling 46 of the apparatus are shown in FIGS. 4 and 5. As illustrated in FIG. 4, the floor 44 and ceiling 46 of the apparatus 18 are both shielded. As mentioned, any known shielding components are appropriate so long as the shield 24 completely covers at least the area exposed to the interior of the apparatus 18 and is formed of electrically conductive material such as steel, aluminum, stainless steel, galvanized steel, copper, lead or turne steel, any of which reflect impinging radiated energy. The specific material used as well as its thickness can be chosen by one having skill in the shielding art based on specific shielding requirements of a given access apparatus.

A conventional floor topping or deck 48 includes electrically non-conductive components and is constructed over the floor 44. The ceiling 46 of the apparatus may include a substrate 50 from which the ceiling shielding 24 is supported.

In addition, a passage ceiling 52 may extend between the protective walls 40, 42 of the passage 36. The passage ceieling 52 is constructed of electrically non-conductive material to prevent undesired reflection of electromagnetic travelling through the apparatus.

The anechoic material 38 is illustrated in FIG. 5. In the preferred embodiment, a single continuous panel 54 of the material covers the entire area of each wall surface within the apparatus. This construction ensures that no gaps will exist between panels at any points intermediate the corners of the walls and that propagating waves will be required to travel through a sufficient volume of the material to enable total absorption of the energy.

It is, of course, possible to embody the invention in other specific forms than those of the preferred embodiment described above. For example, the interior wall of the apparatus can be formed by one of the peripheral walls of the apparatus which can be shaped to protrud into the interior of the apparatus between the two openings. Further, the anechoic material panels can be of any convenient size so long as the interior wall surfaces are substantially covered by the material to ensure effective absorption of electromagnetic waves entering the apparatus. The anechoic material can also be placed on the inside surface of the ceiling shielding to provide further protection from reflected propagation of waves through the enclosure. Any of this may be done without departing from the essence of the invention. The preferred embodiment is merely illustrative and should not be considered restrictive in any way. The scope of the invention is embodied in the appended claims rather than in the preceding description and all variations and changes which fall within the range of the claims are intended to be embraced therein.

What is claimed is:

1. A shielded access apparatus for enabling personnel access to and from a shielding enclosure which is shielded to prevent propagation of radiated electromagnetic energy into and out of the enclosure, the access apparatus comprising:
    an access enclosure of electrically conductive material,
    first and second access openings in said access enclosure,
    a shielding wall within said access enclosure positioned between said first and second access openings for preventing radiated electromagnetic energy passing through one of said openings from travelling along a straight line to the other of said openings, and
    absorbing means within said access enclosure for absorbing radiated electromagnetic energy passing through said access enclosure.

2. The shielded access apparatus of claim 1, wherein said shielding wall includes a layer of electrically conductive material covering said shielding wall.

3. The shielded access apparatus of claim 1, further comprising a personnel passage extending between said first and second access openings to enable personnel to pass through the apparatus.

4. The shielded access apparatus of claim 3, wherein said personnel passage is provided with four turns to enable personnel to pass around said shielding wall while travelling between said first and second access openings.

5. The shielded access apparatus to claim 3, further comprising passage walls between said passage and said absorbing means to define said passage and to prevent said absorbng means from being exposed to said passage.

6. The shielded access apparatus of claim 5, wherein said passage walls include only electrically nonconductive materials so as to prevent reflection of electromagnetic waves propagating through said access enclosure.

7. A shielded access apparatus for enabling personnel access to a shielding enclosure which is shielded to prevent propagation of radiated electromagntic energy into and out of the enclosure, the access apparatus comprising:
- a closed perimeter outer wall having an inside surface area;
- a floor;
- a ceiling;
- first and second access openings in said closed perimeter outer wall;
- an inner wall extending between said floor and said ceiling and positioned between said first and second access openings so that any straight line extending between said first and second access openings intersects said inner wall;
- shielding means for shielding said closed periphery outer walls, said floors, said ceiling, and said inner wall from the passage of radiated electromagnetic energy therethrough; and
- anechoic material covering said inside surface area of said closed perimeter outer wall and at least one surface of said inner wall.

8. The shielded access apparatus of claim 7, wherein said shielding means includes sheets of electrically conductive material which are fastened together to form an uninterrupted conductive layer covering and closed periphery outer walls, said floor, said ceiling, and said inner wall.

9. The shielded access apparatus of claim 7, further comprising a personnel passage extending between said first and second access openings to enable personnel to pass through the apparatus.

10. The shielded access apparatus of claim 9, wherein said personnel passage is provided with four turns to enable personnel to pass around said inner wall while travelling between said first and second access openings.

11. The shielded access apparatus of claim 9, further comprising passage walls between said passage and said anechoic material to define said passage and to prevent said anechoic material from being exposed to said passage.

12. The shielded access apparatus of claim 11, wherein said passage walls include only electrically non-conductive materials so as to prevent reflection of electromagnetic waves propagating through said apparatus.

* * * * *